United States Patent [19]
Song

[11] Patent Number: 5,686,331
[45] Date of Patent: Nov. 11, 1997

[54] FABRICATION METHOD FOR SEMICONDUCTOR DEVICE

[75] Inventor: Du-Heon Song, Kyungki-Do, Rep. of Korea

[73] Assignee: LG Semicon Co., Ltd., Choongcheongbuk-Do, Rep. of Korea

[21] Appl. No.: 773,086

[22] Filed: Dec. 24, 1996

[30]   Foreign Application Priority Data

Dec. 29, 1995  [KR]  Rep. of Korea ................ 67327/1995

[51] Int. Cl.$^6$ ................................................ H01L 21/8232
[52] U.S. Cl. ........................ 437/41; 437/40; 437/44; 437/200
[58] Field of Search ............................ 437/41 R, 40 R, 437/41 SW, 40 SW, 41 RLD, 44, 45, 29, 913, 195, 192, 200, 201; 148/DIG. 147

[56]   References Cited

U.S. PATENT DOCUMENTS

| | | | |
|---|---|---|---|
| 4,577,392 | 3/1986 | Peterson | 437/44 |
| 4,885,259 | 12/1989 | Osinski et al. | 437/44 |
| 5,124,280 | 6/1992 | Wei et al. | 437/200 |
| 5,314,832 | 5/1994 | Deleonibus | 437/190 |
| 5,340,761 | 8/1994 | Loh et al. | 437/44 |
| 5,352,631 | 10/1994 | Sitaram et al. | 437/41 |
| 5,405,790 | 4/1995 | Rahim et al. | 437/200 |
| 5,420,057 | 5/1995 | Bennett et al. | 437/44 |
| 5,496,750 | 3/1996 | Moslehi | 437/44 |
| 5,518,960 | 5/1996 | Tsuchimoto | 437/201 |

*Primary Examiner*—Michael Trinh
*Attorney, Agent, or Firm*—Morgan, Lewis & Bockius LLP

[57]   ABSTRACT

A fabrication method for a semiconductor device which is capable of preventing the shorting of the semiconductor device by performing an ion-implantation of an impurity after forming an insulating layer on a gate electrode, and forming sidewall spacers on the upper surface of the gate electrode and at the sides thereof includes: forming on a semiconductor substrate a pattern including a gate insulating film, a gate electrode on the gate insulating film and a disposable layer on the gate electrode; forming low concentration impurity regions in the substrate by performing an ion implantation, using the pattern as a mask; forming first sidewall spacers at the sides of the pattern; forming high concentration impurity regions in the substrate by performing an ion implantation, using the pattern and the sidewall spacers as a mask; stripping the disposable layer; forming second sidewall spacers at the sides of the first sidewall spacers and on both ends of the upper surface of the gate electrode; and forming a reaction layer of a metal and a silicon on the gate electrode and the high concentration impurity regions.

14 Claims, 5 Drawing Sheets

FABRICATION METHOD FOR SEMICONDUCTOR DEVICE

BACKGROUND OF THE INVENTION

1. Field of the Invention

The present invention relates to a fabrication method for a semiconductor device, and in particular, to an improved fabrication method for a semiconductor device which is capable of preventing the short circuiting of the semiconductor device by forming an insulating layer on a gate electrode, performing an ion-implantation of an impurity and forming sidewall spacers on the upper surface of the gate electrode and at the sides thereof.

2. Description of the Prior Art

FIGS. 1A through 1C are cross-sectional views showing a fabrication method for a semiconductor device according to the conventional art. As shown in FIG. 1A, after a gate oxide film 2 is formed on a semiconductor substrate 1 and a polysilicon film is formed on the gate oxide film 2, a gate electrode 3 is defined in the polysilicon film by a photolithography process and then the polysilicon film is etched. Then, an impurity ion implantation is performed on the semiconductor substrate 1 to form low concentration impurity areas 4, and an insulating layer is formed on the semiconductor substrate 1 and etched to form sidewall spacers 5 at the sides of the gate oxide film 2 and the gate electrode 3. Next, an impurity ion implantation is performed on the semiconductor substrate to form high concentration impurity areas 6.

As shown in FIG. 1B, a metallic layer 7 is formed in such a manner that it may cover the semiconductor substrate 1, the sidewall spacers 5 and the gate electrode 3.

Then, as shown in FIG. 1C, the portion of the metallic layer 7 on the sidewall spacer 5 is stripped by a wet etching. Then, a silicide film 8 is formed in the drain/source areas by the reaction with the metallic layer 7, and a polysilicide film 9 is formed on the gate electrode 3.

Generally, the miniaturization in the size of the semiconductor devices and the higher integration of the devices require a shallow junction. However, since a sheet resistance is rapidly getting bigger when the shallow junction is embodied by n+ or p+ impurity implantation as in the conventional lightly doped drain(LDD) device, the efficiency of the semiconductor device is much influenced. As shown in FIG. 1B, after a metallic layer is deposited and reacted on the semiconductor substrate, the metallic layer on the sidewall spacers is stripped by a wet etching, but during this course, the metallic layer 7 on the sidewall spacers is not entirely stripped and remains thereon. Therefore, the residual metallic layer causes a bridging phenomenon between the gate electrode and the drain/source, resulting in the electrical shorting of the semiconductor device.

Further, since an impurity is penetrated through the gate electrode by forming an LDD area by an n- or p- impurity ion implantation on the gate electrode, a threshold voltage is varied and the quality of the gate oxide film is lowered, resulting in lowering the characteristics of the semiconductor device.

SUMMARY OF THE INVENTION

Therefore, it is an object of the present invention to provide an improved fabrication method for a semiconductor device capable of preventing a bridging phenomenon between a gate electrode and drain/source areas.

It is another object of the present invention to provide an improved fabrication method for a semiconductor device capable of preventing damage to a gate oxide film when performing an etching.

It is still another object of the present invention to provide an improved fabrication method for a semiconductor device capable of providing a sufficient margin when a self-aligned contact formation is carried out.

To achieve the above objects, there is provided an improved fabrication method for a semiconductor device which includes the steps of; forming on a semiconductor substrate a pattern including a gate insulating film, a gate electrode on the gate insulating film and a disposable layer on the gate electrode; forming low concentration impurity areas in the substrate by performing an ion implantation with the pattern used as a mask; forming first sidewall spacers at the sides of the pattern; forming high concentration impurity areas in the substrate by performing an ion implantation using the pattern and the sidewall spacers as a mask; stripping the disposable layer, forming second sidewall spacers at the sides of the first sidewall spacers and on both ends of the upper surface of the gate electrode; and forming a reaction layer of a metal and a silicon on the gate electrode and the high concentration impurity areas.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
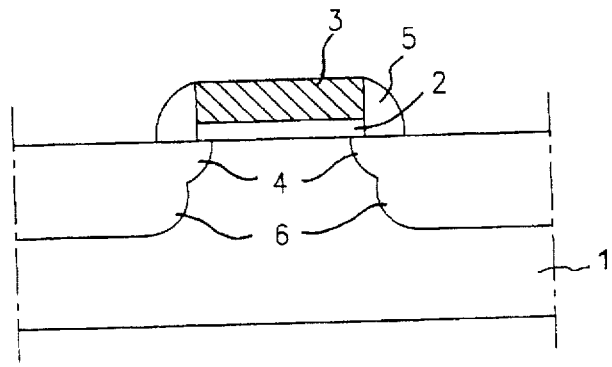
FIGS. 1A through 1C are cross-sectional views showing a fabrication method for a semiconductor device according to the conventional art.
Figure 1B:
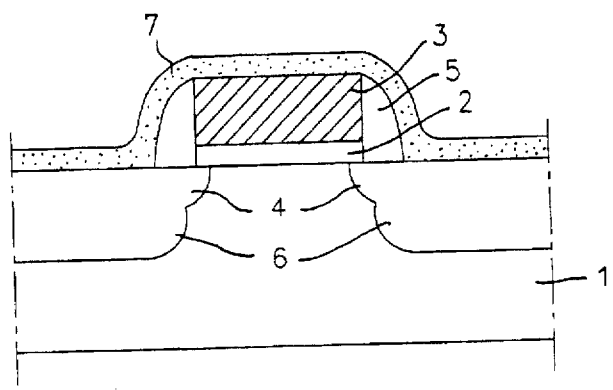
Figure 1C:
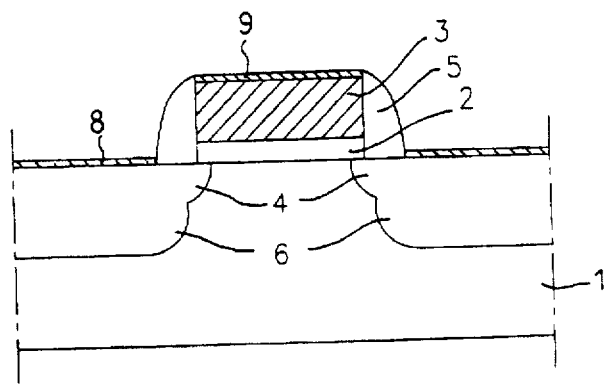

FIGS. 2A through 2H are cross-sectional views showing a fabrication method for a semiconductor device according to the present invention, in which identical reference numerals are used for the same elements as those in the conventional art of FIGS. 1A through 1C.

Figure 2A:
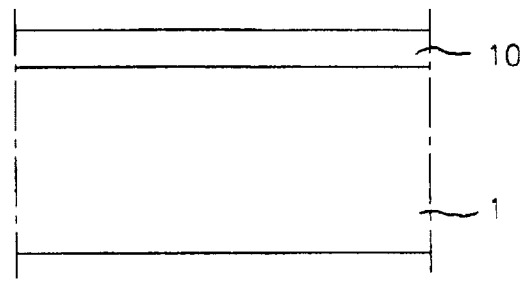
FIGS. 2A through 2J are cross-sectional views showing a fabrication method for a semiconductor device according to the present invention.

First, as shown in FIG. 2A, a dielectric film is formed to be a gate insulating film 10 on a semiconductor substrate 1.

Figure 2B:
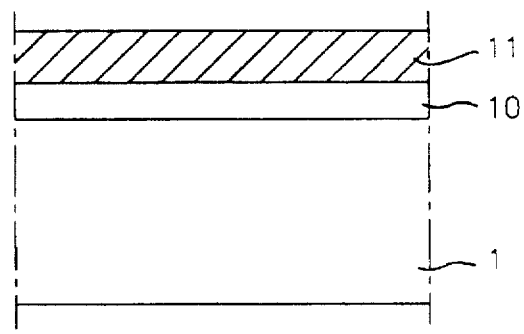

Then, as shown in FIG. 2B, a gate electrode 11 is formed on the gate insulating film 10.

Figure 2C:
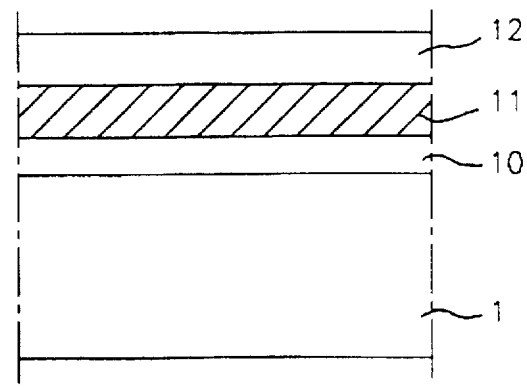

Next, as shown in FIG. 2C, a disposable layer 12 is formed to be an insulating layer on the gate electrode 11.

Figure 2D:
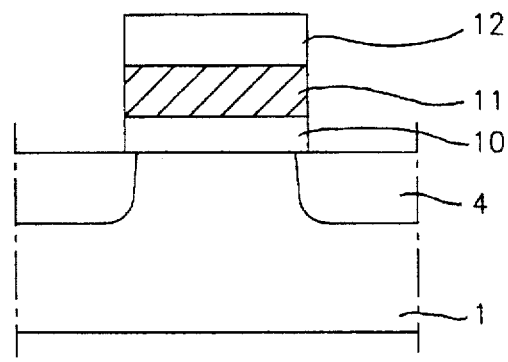

As shown in FIG. 2D, a pattern including the gate insulating film 10, the gate electrode 11 and the disposable layer is formed on the semiconductor substrate 1 by a photolithography process. Then, using the pattern as a mask, impurity ions are implanted to form a low concentration impurity regions 4 in the semiconductor substrate.

Figure 2E:
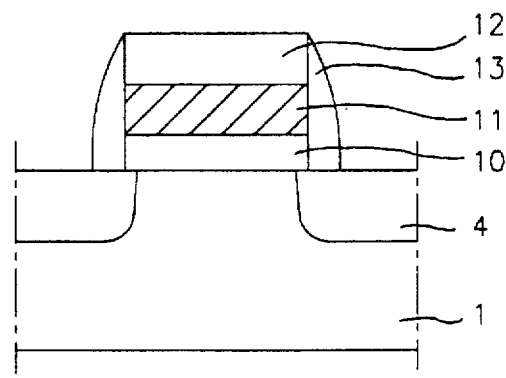

As shown in FIG. 2E, after another insulating layer is formed on the semiconductor substrate 1 and the disposable layer 12, the insulating layer is etched to form first sidewall spacers 13 at the sides of the pattern.

The first sidewall spacers 13 have a larger etch selectivity in comparison with the disposable layer 12.

The disposable layer 12 is composed of an oxide film, and the first sidewall spacers 13 are composed of a nitride film, but the vice versa is possible.

Figure 2F:
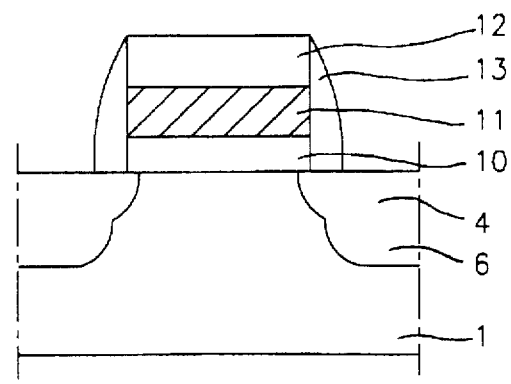

Then, as shown in FIG. 2F, using the pattern and the first sidewall spacers 13 as a mask, impurity ions are implanted to form high concentration impurity regions 6 in the semiconductor substrate 1.

Figure 2G:
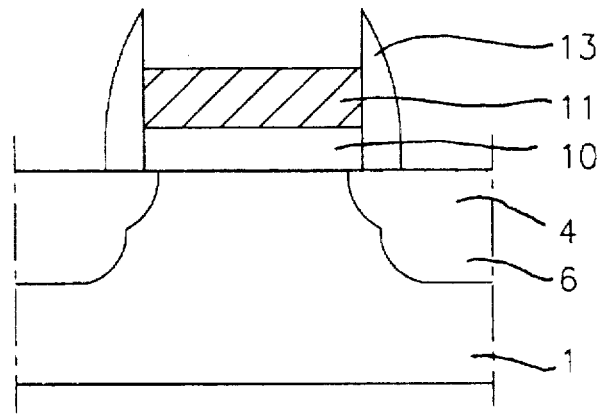

Then, as shown in FIG. 2G, the disposable layer 12 is stripped by a wet etching.

Figure 2H:
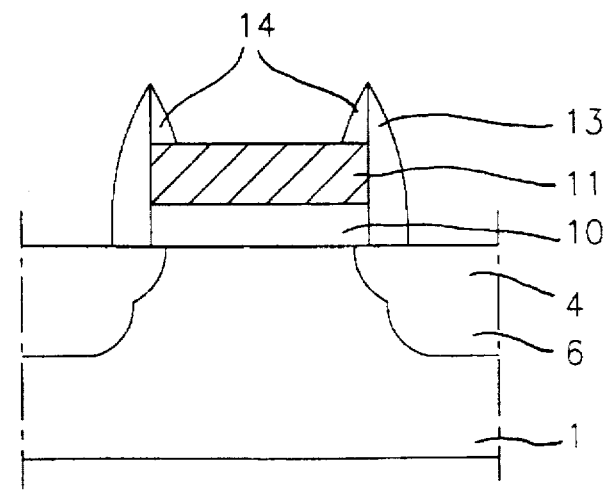

Then, as shown in FIG. 2H, after another insulating layer is formed on the semiconductor substrate, and then the insulating layer is etched to form second sidewall spacers 14 at an upper portion of the inner vertical sides of the first sidewall spacers 13 and on both ends of the upper surface of the gate electrode 11.

Figure 2I:
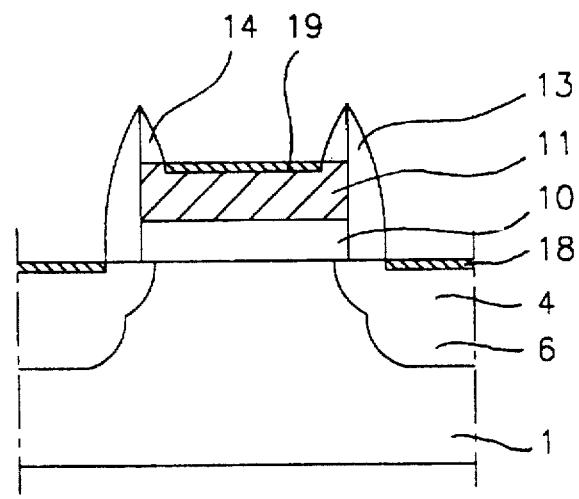

As shown in FIG. 2I, a transfer metal is then deposited or ion-implanted on an entire surface of the semiconductor substrate 1 having the gate electrode 11 thereon to form a reaction layer of a metal and a silicon on the semiconductor substrate 1 and the gate electrode 11. That is, by the reaction of the transfer metal with the semiconductor substrate 1, a silicide 18 is formed at the drain/source regions in the semiconductor substrate 1 and a polysilicide 19 is formed in the upper portion in the gate electrode 11. Then, the metallic layers on the first and second sidewall spacers 13,14 are stripped by a wet-etching.

The reaction layer is formed by performing an ion implantation of a metal on the semiconductor substrate 1 and annealing the same, wherein the metal used is selected from among Co, Mo, W and Ti. The annealing temperature is about 600°~850° C. and the temperature of the semiconductor substrate 1 in the metal ion implantation must be maintained to be 300°~400° C. The metal ions are implanted under the condition that the dosage is about 1-7E15/cm and the energy is 20–30 KeV. Further, the metallic layer 7 can be formed by a sputtering method.

Figure 2J:
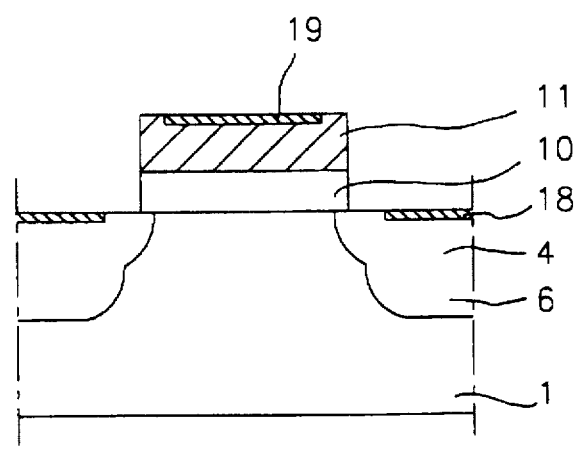

As shown in FIG. 2J, the first and second sidewall spacers 13,14 are then stripped by dry or wet etching to complete the fabrication.

As described above, the present invention has the following effects:

By extending the space by which the drain/source and the gate electrodes can be electrically shorted, a bridging phenomenon occurring between the drain/source and the gate electrode after the metallic layer and the silicon are allowed to be reacted and the metallic layer is wet etched can be effectively prevented.

And, since low and high concentration impurity regions are formed by implanting impurity ions, using an insulating layer as a mask, the problem that the impurity ions are penetrated through the gate electrode can be solved.

Furthermore, a sufficient margin can be advantageously provided when a self-aligned contact formation is carried out.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a semiconductor device, comprising the steps of:

forming on a semiconductor substrate a pattern including a gate insulating film, a gate electrode on the gate insulating film and a disposable layer on the gate electrode;

forming low concentration impurity regions in the substrate by performing an ion implantation, using the pattern as a mask;

forming first sidewall spacers at sides of the pattern;

forming high concentration impurity regions in the substrate by performing an ion implantation, using the pattern and the sidewall spacers as a mask;

stripping the disposable layer;

forming second sidewall spacers at inner sides of the first sidewall spacers and on both ends of an upper surface of the gate electrode; and forming a reaction layer of a metal and a silicon on the gate electrode and the high concentration impurity regions.

2. The fabrication method of claim 1, wherein the first sidewall spacers have a larger etch selectivity in comparison with the second sidewall spacers.

3. The fabrication method of claim 1, wherein a silicide is formed at drain/source regions in the semiconductor substrate and a polysilicide is formed in an upper portion in the gate electrode by the reaction of a transfer metal with the semiconductor substrate.

4. The fabrication method of claim 1, wherein the disposable layer is composed of an oxide film, and the first sidewall spacers are composed of a nitride film.

5. The fabrication method of claim 1, wherein the disposable layer is composed of a nitride film, and the first sidewall spacers are composed of an oxide film.

6. The fabrication method of claim 1, wherein the gate electrode are composed of a polysilicon.

7. The fabrication method of claim 1, wherein the formation of the reaction layer comprises the steps of:

performing an ion implantation of a metal on the semiconductor substrate; and reacting the metal with the substrate, and the metal with the gate electrode by annealing.

8. The fabrication method of claim 7, wherein the metal used is selected from among Co, Mo, W and Ti.

9. The fabrication method of claim 7, wherein the annealing temperature is about 600°~850° C.

10. The fabrication method of claim 7, wherein the temperature of the semiconductor substrate in the metal ion implantation is maintained to be 300°~400° C.

11. The fabrication method of claim 7, wherein the metal ions are implanted under the condition that a dosage is about 1-7E15/cm and an energy is 20–30 KeV.

12. The fabrication method of claim 7, wherein the formation of the reaction layer further comprises stripping the first and second sidewall spacers.

13. The fabrication method of claim 1, wherein the formation of the reaction layer of a metal and a silicon comprises the steps of:

forming a metallic layer on the gate electrode and the substrate including the high concentration impurity regions by a sputtering process after stripping the disposable layer; and reacting the metallic layer with the substrate, and the metallic layer with the gate electrode by annealing.

14. The fabrication method of claim 13, wherein the formation of the reaction layer further comprises a step of stripping the first and second sidewall spacers.

* * * * *